United States Patent
Chou et al.

(10) Patent No.: US 8,421,121 B2
(45) Date of Patent: Apr. 16, 2013

(54) ANTIMONIDE-BASED COMPOUND SEMICONDUCTOR WITH TITANIUM TUNGSTEN STACK

(75) Inventors: Yeong-Chang Chou, Irvine, CA (US); Jay Crawford, Long Beach, CA (US); Jane Lee, Torrance, CA (US); Jeffrey Ming-Jer Yang, Cerritos, CA (US); John Bradley Boos, Springfield, VA (US); Nicolas Alexandrou Papanicolaou, Potomac, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 645 days.

(21) Appl. No.: 11/788,145

(22) Filed: Apr. 18, 2007

(65) Prior Publication Data

US 2008/0258176 A1 Oct. 23, 2008

(51) Int. Cl.
  *H01L 29/778* (2006.01)
(52) U.S. Cl.
  USPC .................. 257/194; 257/192; 257/E29.246
(58) Field of Classification Search .................. 257/192, 257/194, E21.403, E21.407, E21.241, 403, 257/E29.246, E29.248; 438/174, 714
  See application file for complete search history.

(56) References Cited

U.S. PATENT DOCUMENTS

| | | | |
|---|---|---|---|
| 4,711,701 A * | 12/1987 | McLevige | 438/183 |
| 4,951,121 A * | 8/1990 | Furukawa et al. | 257/751 |
| 4,995,049 A * | 2/1991 | Kahen et al. | 372/50.1 |
| 5,144,378 A | 9/1992 | Hikosaka | |
| 5,385,851 A * | 1/1995 | Misawa et al. | 438/571 |
| 5,485,025 A | 1/1996 | Chau et al. | |
| 5,512,496 A | 4/1996 | Chau et al. | |
| 5,594,297 A | 1/1997 | Shen et al. | |
| 5,601,466 A | 2/1997 | Shen et al. | |
| 5,670,823 A * | 9/1997 | Kruger et al. | 257/751 |
| 5,798,540 A | 8/1998 | Boos et al. | |
| 5,804,877 A | 9/1998 | Fuller et al. | |
| 5,828,101 A | 10/1998 | Endo | |
| 6,027,632 A | 2/2000 | Knall et al. | |
| 6,133,593 A | 10/2000 | Boos et al. | |
| 6,191,021 B1 * | 2/2001 | Fuller et al. | 438/606 |
| 6,288,429 B1 | 9/2001 | Iwata et al. | |
| 6,342,411 B1 * | 1/2002 | Pitts, Jr. | 438/173 |
| 6,787,826 B1 | 9/2004 | Tserng et al. | |
| 6,849,882 B2 | 2/2005 | Chavarkar et al. | |
| 6,858,509 B2 | 2/2005 | Delage et al. | |
| 6,867,078 B1 * | 3/2005 | Green et al. | 438/167 |
| 6,929,966 B2 | 8/2005 | Illek et al. | |
| 6,934,129 B1 * | 8/2005 | Zhang et al. | 360/322 |
| 7,029,938 B2 | 4/2006 | Kurokawa et al. | |
| 7,112,824 B2 | 9/2006 | Yukimoto et al. | |

(Continued)

OTHER PUBLICATIONS

J.B. Boos et al; A1Sb/InAs HEMTs with a TiW/Au Gate Metalization for Improved Stability; Solid-State Electroinics 47 (2003); p. 181-184; May 6, 2002; Elsevier Science Ltd.; Washington, DC USA.

*Primary Examiner* — Cuong Q Nguyen
*Assistant Examiner* — Yosef Gebreyesus
(74) *Attorney, Agent, or Firm* — Carmen Patti Law Group, LLC

(57) ABSTRACT

An apparatus in one example comprises an antimonide-based compound semiconductor (ABCS) stack, an upper barrier layer formed on the ABCS stack, and a gate stack formed on the upper barrier layer. The upper barrier layer comprises indium, aluminum, and arsenic. The gate stack comprises a base layer of titanium and tungsten formed on the upper barrier layer.

14 Claims, 5 Drawing Sheets

U.S. PATENT DOCUMENTS

| | | |
|---|---|---|
| 7,135,411 B2 | 11/2006 | Nam et al. |
| 7,557,046 B1* | 7/2009 | Veliadis ......................... 438/740 |
| 2002/0121648 A1* | 9/2002 | Hsu et al. ....................... 257/194 |
| 2003/0141518 A1* | 7/2003 | Yokogawa et al. ............ 257/194 |
| 2003/0173584 A1* | 9/2003 | Nikaido ......................... 257/194 |
| 2003/0207561 A1* | 11/2003 | Dubin et al. .................. 438/630 |
| 2004/0178422 A1* | 9/2004 | Tserng et al. .................. 257/192 |
| 2005/0110054 A1* | 5/2005 | Wohlmuth ..................... 257/267 |
| 2006/0003518 A1* | 1/2006 | Harter et al. ................... 438/222 |
| 2006/0035467 A1* | 2/2006 | Nam et al. ..................... 438/706 |
| 2006/0049427 A1* | 3/2006 | Takahashi ...................... 257/194 |

* cited by examiner

ANTIMONIDE-BASED COMPOUND SEMICONDUCTOR WITH TITANIUM TUNGSTEN STACK

STATEMENT OF GOVERNMENT RIGHTS

The Government of the United States of America has rights in this invention pursuant to Contract No. FA8750-06-C-0051 awarded by the Air Force Research Laboratory.

TECHNICAL FIELD

The invention relates generally to semiconductors and more particularly to antimonide based semiconductors.

BACKGROUND

For high electron mobility transistors (HEMT) with an epitaxial profile that has a thin barrier layer, such as antimonide-based compound semiconductors (ABCS), selection of a gate structure has been a challenge. To enhance adhesion, titanium is desirable because it reacts readily with the semiconductor. However, since the barrier layer is thin, the reaction between the titanium and the semiconductor often results in gate sinking and a non-functional transistor. This problem is accelerated by high processing temperatures for creation of the HEMT. For example, temperature cycles during the creation of the HEMT create stress at a metal-semiconductor interface, which causes a degradation of the transistor characteristics.

SUMMARY

The invention in one implementation encompasses an apparatus. The apparatus comprises an antimonide-based compound semiconductor (ABCS) stack, an upper barrier layer formed on the ABCS stack, and a gate stack formed on the upper barrier layer. The upper barrier layer comprises indium, aluminum, and arsenic. The gate stack comprises a base layer of titanium and tungsten formed on the upper barrier layer.

Another implementation of the invention encompasses a high electron mobility transistor (HEMT). The HEMT comprises an antimonide-based compound semiconductor (ABCS) stack, an upper barrier layer formed on the ABCS stack, and a gate stack formed on the upper barrier layer. The gate stack comprises a base layer formed on the upper barrier layer, a gate barrier layer formed on the base layer, and a contact layer formed on the gate barrier layer. The base layer provides a thermally stable contact with the upper barrier layer. The gate barrier layer prevents the contact layer from diffusing into the ABCS stack.

A further implementation of the invention encompasses a method. An upper barrier layer of indium, aluminum, and arsenic is formed on an antimonide-based compound semiconductor (ABCS) stack. A base layer of titanium and tungsten is formed on the upper barrier layer to prevent diffusion of a contact layer into the ABCS stack. The contact layer is formed on the base layer with layers of titanium, platinum, and gold.

DESCRIPTION OF THE DRAWINGS

Features of example implementations of the invention will become apparent from the description, the claims, and the accompanying drawings in which:

DETAILED DESCRIPTION

Figure 1:
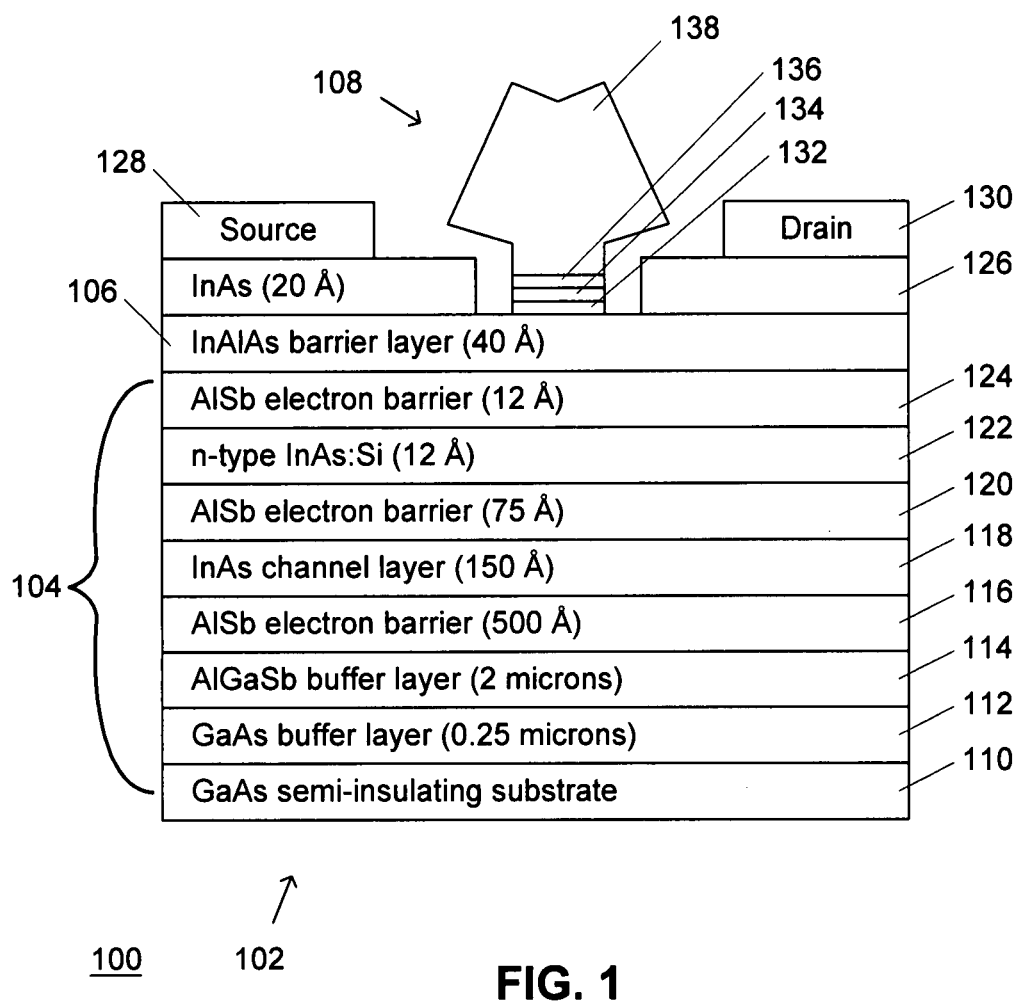
FIG. 1 is a representation of one implementation of an apparatus that comprises a profile of a semiconductor structure.

Turning to FIG. 1, an apparatus 100 in one embodiment comprises a semiconductor structure 102. The semiconductor structure 102 comprises an antimonide-based compound semiconductor (ABCS) stack 104, an upper barrier layer 106, and a gate stack 108. The semiconductor structure 102 in one example forms a transistor, for example, a high electron mobility transistor (HEMT). The ABCS stack 104, the upper barrier layer 106, and the gate stack 108 in one example provide a HEMT with an improvement in performance, uniformity, reliability, and manufacturing yields and that operates with low DC power. Tests performed on a HEMT formed in accordance with the semiconductor structure 102 showed a peak transconductance greater than 1400 ms/mm, a gate leakage current less than 1 mA/mm, and a pinch-off current of 5 mA/mm.

The ABCS stack 104 in one example comprises a stacked arrangement of layers with at least one antimonide-based layer. In the embodiment of FIG. 1, the ABCS stack 104 comprises a semi-insulating substrate 110, a first buffer layer 112, a second buffer layer 114, a first electron barrier 116, a channel layer 118, a second electron barrier 120, an n-type layer 122, and a third electron barrier 124.

Referring to the embodiment of FIG. 1, the semi-insulating substrate 110 comprises gallium arsenide. The first buffer layer 112 comprises a layer of gallium arsenide of approximately 0.25 microns. The second buffer layer 114 comprises a layer of aluminum, gallium, and antimony which is relatively thicker than the first buffer layer 112, at approximately 2 microns. In one example, the second buffer layer 114 comprises a layer of $Al_{0.7}Ga_{0.3}Sb$. In another example, the second buffer layer 114 comprises a lower layer of aluminum antimonide of approximately 1.7 microns and an upper layer of aluminum gallium antimonide of approximately 0.3 microns. The first electron barrier 116, second electron barrier 120, and third electron barrier 124 comprise layers of aluminum antimonide with thicknesses of approximately 500 angstroms, 75 angstroms, and 12 angstroms, respectively. The channel layer 118 comprises a layer of indium arsenide of approximately 150 angstroms. The n-type layer 122 comprises a layer of indium arsenide with silicon of approximately 12 angstroms. Alternative materials and thicknesses may be used within the ABCS stack 104, as will be appreciated by those skilled in the art.

The upper barrier layer 106, in the embodiment of FIG. 1, comprises a layer of indium aluminum arsenide of approximately 40 angstroms. The upper barrier layer 106 serves as a hole barrier layer. A contact cap 126 is formed on the upper barrier layer 106. The contact cap 126 in this embodiment comprises a layer of indium arsenide of 20 angstroms. A source contact 128 and a drain contact 130 may be formed on the contact cap 126, as will be appreciated by those skilled in the art.

The gate stack 108 in one example is formed with an electron beam evaporation process. The gate stack 108 comprises a base layer 132, a lower gate barrier layer 134, an upper gate barrier layer 136, and a contact layer 138. The base layer 132 comprises a layer of titanium and tungsten of approximately 20-50 angstroms. The titanium and tungsten of the base layer 132 allows for good adhesion of the gate stack 108 to the upper barrier layer 106 while providing thermal stability, without the gate sinking as with a pure titanium solution. The contact layer 138 comprises a layer of gold. A gate barrier layer is formed between the base layer 132 and the contact layer 138. The gate barrier layer comprises a lower gate barrier layer 134 of titanium and an upper gate barrier layer 136 of platinum. The titanium of the lower gate barrier layer 134 prevents the platinum and gold from diffusing into the ABCS stack 104. The platinum of the upper gate barrier layer 136 further prevents the gold from diffusing into the ABCS stack 104, as will be appreciated by those skilled in the art. The lower gate barrier layer 134 in one example is approximately between 300-400 angstroms. The upper gate barrier layer 136 in one example is approximately between 300-500 angstroms. The contact layer 138 in one example is approximately between 4500-6500 angstroms.

Figure 2:
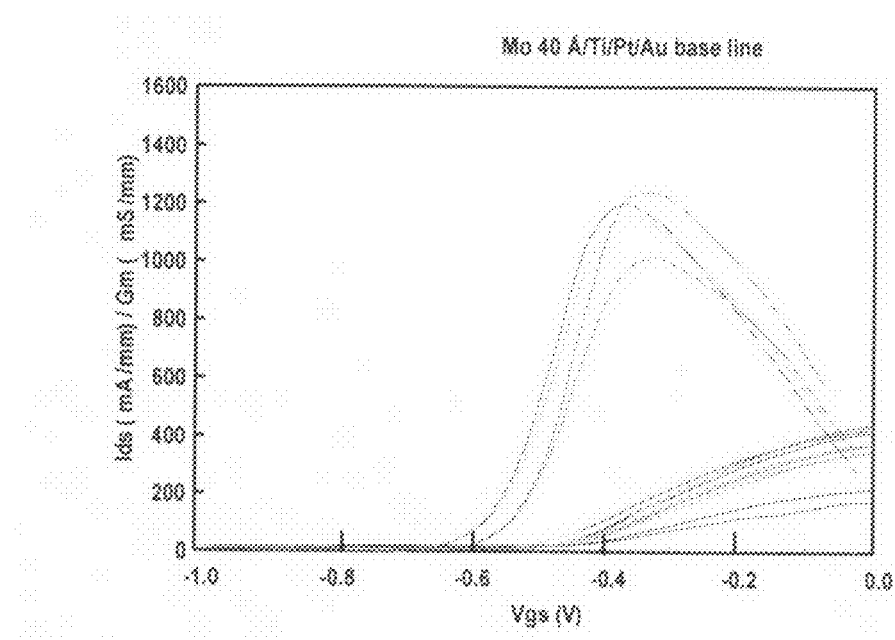
FIG. 2 is a representation of a device uniformity plot for a molybdenum based transistor.
Figure 3:
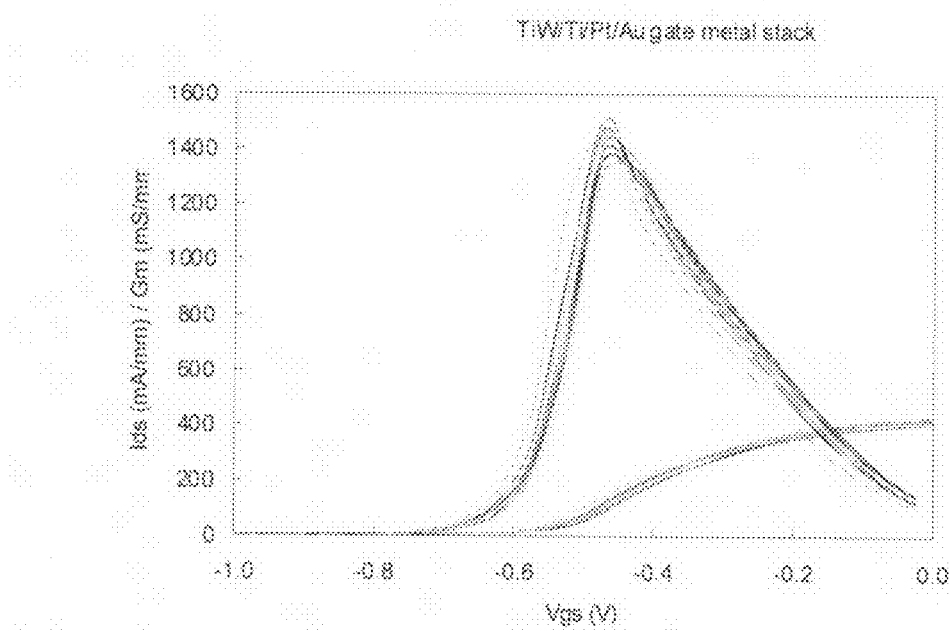
FIG. 3 is a representation of a device uniformity plot for a transistor of the semiconductor structure of FIG. 1.
Figure 4:
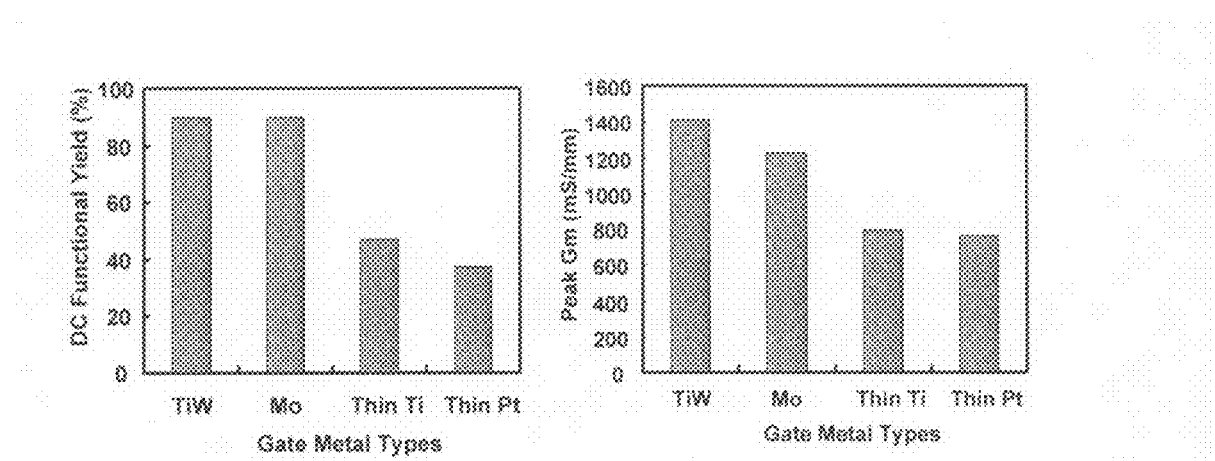
FIG. 4 is a representation of an electrical performance plot for several gate materials.
Figure 5:
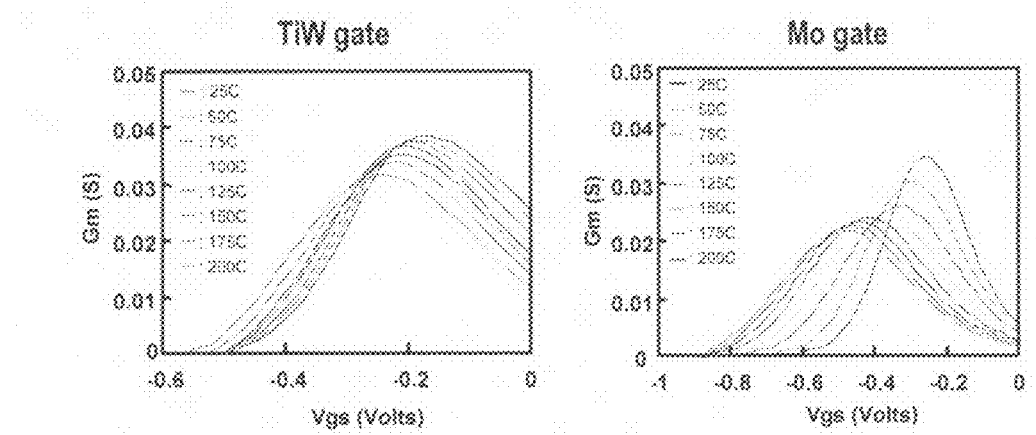
FIG. 5 is a representation of a thermal stability comparison for the transistors of FIGS. 2 and 3.
Figure 6:
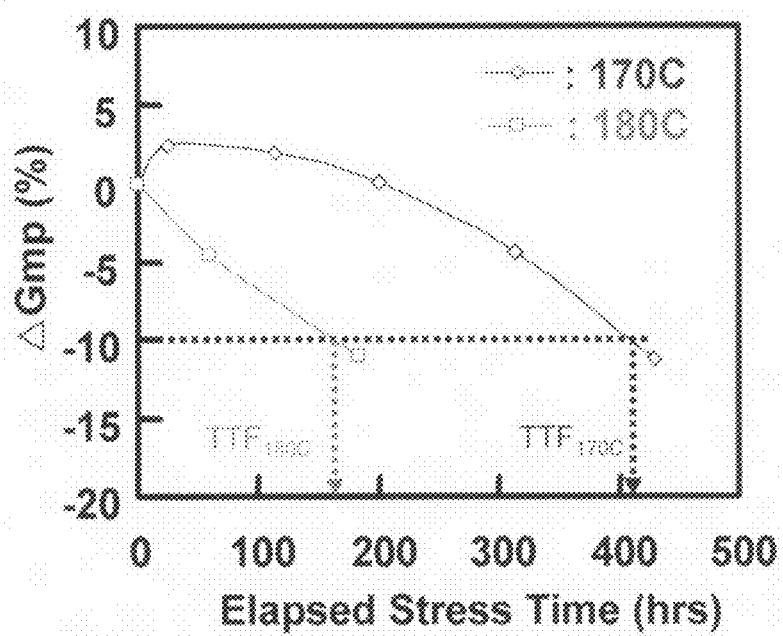
FIG. 6 is a representation of an on-wafer reliability plot for the transistor of FIG. 3.
Figure 7:
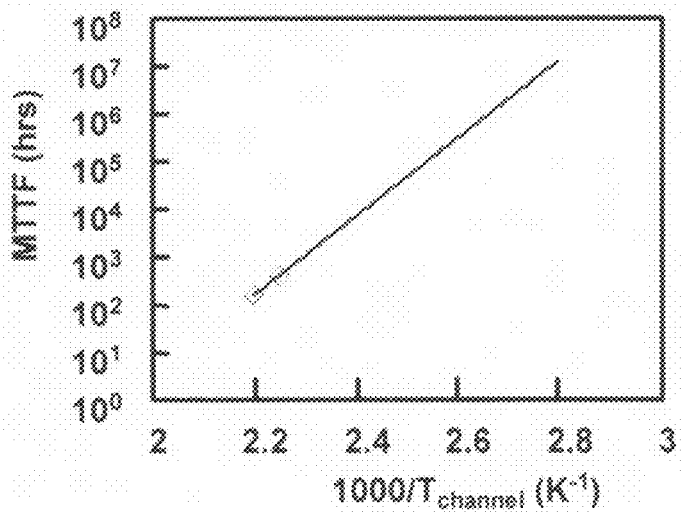
FIG. 7 is a representation of another on-wafer reliability plot for the transistor of FIG. 3.

Turning to FIG. 2, a device uniformity plot for a transistor with an ABCS stack and a gate stack of molybdenum, titanium, platinum, and gold is shown. Turning to FIG. 3, a device uniformity plot for a transistor with the semiconductor structure of FIG. 1 is shown. Turning to FIG. 4, electrical performance plots for several gate materials for the base layer 132 are shown. Turning to FIG. 5, one example of a thermal stability comparison for the transistors of FIGS. 2 and 3 is shown. Turning to FIGS. 6 and 7, example results from an on-wafer reliability test for the transistor of FIG. 3 are shown.

Figure 8:
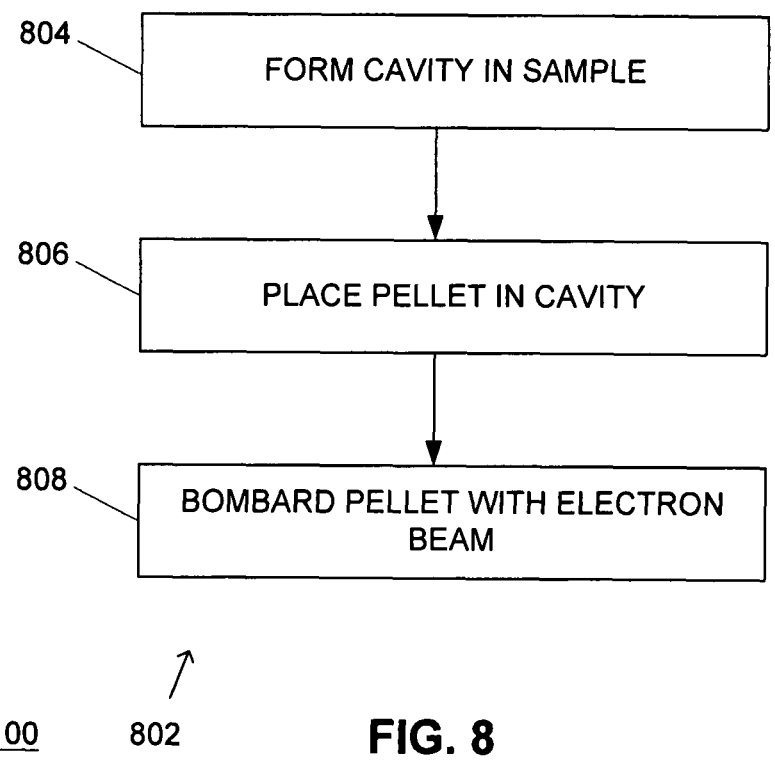
FIG. 8 is a representation of one implementation of a method for forming a base layer of the apparatus of FIG. 1.

Turning to FIG. 8, one example of a process flow 802 for deposition of the base layer 132 is shown. The process flow 802 in one example comprises an electron beam evaporation process. A cavity is drilled or formed within (STEP 804) a titanium tungsten sample. The titanium tungsten sample in one example comprises a 15 cm$^3$ block or cylinder of titanium tungsten. A titanium tungsten pellet is placed (STEP 806) in the cavity. The cavity in one example is 0.25 inches in diameter and the titanium tungsten pellet is a 0.25 inch cube. The titanium tungsten pellet is bombarded (STEP 808) with an electron beam to evaporate the titanium tungsten pellet. The electron beam may be controlled to adjust the evaporation rate and accordingly the deposition rate of the titanium tungsten. In one example, the deposition rate is regulated to approximately 0.3 angstroms per second. The titanium tungsten pellet may be replaced for subsequent deposition sessions. With the regulated deposition rate of 0.3 angstroms per second, the base layer 132 in one example is formed in approximately 60 to 180 seconds. The relatively short duration of the deposition reduces damage to the ABCS stacks 104 and 106. In addition, the relatively thin layer of titanium tungsten of the base layer 132 has low mechanical stress, as will be appreciated by those skilled in the art.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
an antimonide-based compound semiconductor (ABCS) stack;
an upper barrier layer of indium, aluminum, and arsenic formed on the ABCS stack;
a gate stack formed on the upper barrier layer;
wherein the gate stack comprises a base layer that consists of titanium and tungsten, the base layer being formed on the upper barrier layer, the base layer having a thickness of approximately 20-50 angstroms,
wherein a gate barrier layer is formed on the base layer; and
wherein the gate barrier layer comprises a lower gate barrier layer comprising titanium, and an upper gate barrier layer comprising platinum.

2. The apparatus of claim 1, further comprising a contact layer formed on the gate barrier layer.

3. The apparatus of claim 2, wherein the upper gate barrier layer is formed on the lower gate barrier layer; and
wherein the contact layer comprises a layer of gold.

4. The apparatus of claim 3, wherein the lower gate barrier layer, the upper gate barrier layer, and the contact layer of the gate stack comprise approximate thicknesses between 300-400 angstroms, 300-500 angstroms, and 4500-6500 angstroms, respectively;
wherein the upper barrier layer comprises a thickness of approximately 40 angstroms.

5. The apparatus of claim 1, wherein the ABCS stack comprises:
a semi-insulating substrate;
a first buffer layer formed on the semi-insulating substrate;
a second buffer layer formed on the first buffer layer;
a first electron barrier formed on the second buffer layer;
a channel layer formed on the first electron barrier;
a second electron barrier layer formed on the channel layer;
an n-type layer formed on the second electron barrier; and
a third electron barrier layer formed on the n-type layer;
wherein the upper barrier layer is formed on the third electron barrier layer.

6. The apparatus of claim 5, wherein at least one of the first electron barrier layer, the second electron barrier layer, and the third electron barrier layer comprise antimony.

7. The apparatus of claim 5, wherein the first electron barrier layer, the second electron barrier layer, and the third electron barrier layer comprise aluminum and antimony.

8. The apparatus of claim 7, wherein the first electron barrier layer, the second electron barrier layer, and the third electron barrier layer comprise approximate thicknesses of 500, 75, and 12 angstroms, respectively.

9. The apparatus of claim 7, wherein the semi-insulating substrate comprises gallium arsenide;
wherein the first buffer layer comprises gallium arsenide;
wherein the second buffer layer comprises aluminum gallium antimonide;
wherein the channel layer comprises indium arsenide;
wherein the n-type layer comprises indium arsenide and silicon.

10. The apparatus of claim 9, wherein the second buffer layer comprises $Al_{0.7}Ga_{0.3}Sb$.

11. The apparatus of claim 10, wherein the first buffer layer, the second buffer layer, the channel layer, and the n-type layer comprise approximate thicknesses of 0.25 microns, 2 microns, 150 angstroms, and 12 angstroms, respectively.

12. A high electron mobility transistor, comprising:
an antimonide-based compound semiconductor (ABCS) stack;
an upper barrier layer formed on the ABCS stack;
a gate stack formed on the upper barrier layer;
wherein the gate stack comprises a first diffusion prevention layer comprising a base layer that consists of titanium and tungsten, the base layer being formed on the upper barrier layer, a gate barrier layer formed on the base layer, and a contact layer formed on the gate barrier layer;
wherein the base layer is configured to provide a thermally stable contact with the upper barrier layer, the base layer having a thickness of approximately 20-50 angstroms,
wherein the gate barrier layer is configured to prevent the contact layer from diffusing into the ABCS stack; and
wherein the gate barrier layer further comprises a second diffusion prevention layer formed on the base layer and a third diffusion prevention layer formed on the second diffusion prevention layer where the second diffusion prevention layer comprises a lower gate barrier layer comprising titanium, and the third diffusion prevention layer comprises an upper gate barrier layer comprising platinum.

13. The high electron mobility transistor of claim 12, wherein the upper barrier layer comprises indium, aluminum, and arsenic;
wherein the contact layer comprises a gold layer.

14. The high electron mobility transistor of claim 13, further comprising:
an indium arsenide cap layer formed on the upper barrier layer;
a source contact and a drain contact formed on the indium arsenide cap layer adjacent to the gate stack;
wherein the ABCS stack comprises the following layers:
a gallium arsenide substrate, a gallium arsenide buffer layer, an aluminum gallium antimony buffer layer, a first aluminum antimonide layer, an indium arsenide layer, a second aluminum antimonide layer, an indium arsenide and silicon layer, and a third aluminum antimonide layer;
wherein the upper barrier layer is formed on the third aluminum antimonide layer; and
wherein the lower gate barrier layer is approximately 300-400 angstroms thick and the upper gate barrier layer is approximately 300-500 angstroms thick.

* * * * *